(12) United States Patent
Reineccius et al.

(10) Patent No.: US 11,531,079 B2
(45) Date of Patent: Dec. 20, 2022

(54) MULTI-METER ENERGY ALLOCATION SYSTEM WITH NO BACK FEED

(71) Applicant: POWERTREE SERVICES, INC., San Francisco, CA (US)

(72) Inventors: Stacey Reineccius, San Francisco, CA (US); John C. Sellers, El Cerrito, CA (US)

(73) Assignee: POWERTREE SERVICES, INC., San Francisco, CA (US)

( * ) Notice: Subject to any disclaimer, the term of this patent is extended or adjusted under 35 U.S.C. 154(b) by 195 days.

(21) Appl. No.: 17/133,338

(22) Filed: Dec. 23, 2020

(65) Prior Publication Data
US 2022/0196777 A1 Jun. 23, 2022

(51) Int. Cl.
*G01R 35/04* (2006.01)
*G01R 22/06* (2006.01)

(52) U.S. Cl.
CPC .......... *G01R 35/04* (2013.01); *G01R 22/065* (2013.01)

(58) Field of Classification Search
CPC ...... G01R 22/00; G01R 22/06; G01R 22/061; G01R 22/065; G01R 35/00; G01R 35/04
See application file for complete search history.

(56) References Cited

U.S. PATENT DOCUMENTS

| | | | |
|---|---|---|---|
| 9,912,160 B2 | 3/2018 | Reineccious et al. | |
| 2010/0250018 A1* | 9/2010 | Hauf | H02J 1/10 700/297 |
| 2012/0218794 A1* | 8/2012 | Kake | H02J 3/38 363/95 |
| 2013/0119898 A1* | 5/2013 | Ohkura | H02J 7/04 320/134 |
| 2013/0166081 A1* | 6/2013 | Sanders | G05B 11/01 700/286 |
| 2015/0377939 A1* | 12/2015 | Ishihara | G01R 25/005 324/107 |
| 2017/0005515 A1* | 1/2017 | Sanders | H02J 3/381 |
| 2017/0008413 A1* | 1/2017 | Reineccius | H02J 3/14 |
| 2017/0310114 A1* | 10/2017 | Veeraraghavan | H02J 3/466 |
| 2019/0027960 A1* | 1/2019 | Agrawal | H02J 9/062 |
| 2020/6036190 | 1/2020 | Knox et al. | |
| 2022/0121260 A1* | 4/2022 | King | H02J 3/007 |

* cited by examiner

*Primary Examiner* — Huy Q Phan
*Assistant Examiner* — David B Frederiksen
(74) *Attorney, Agent, or Firm* — Geoffrey Lottenberg; Berger Singerman LLP

(57) ABSTRACT

A power generation allocation and measurement device has an inverter assignment matrix fed by one or more inverter load controllers, the controllers connected to respective inverters. The device includes multiple unit controllers associated with respective metered distribution panels of a multi-unit or multi-panel power installation. A group controller is in communication with each unit controller and the inverter assignment matrix. The device is fed by a power generator such as a photovoltaic panel. The device allocates power to the metered distribution panels via the group controller, based on feedback from the discrete unit controllers.

17 Claims, 7 Drawing Sheets

MULTI-METER ENERGY ALLOCATION SYSTEM WITH NO BACK FEED

BACKGROUND OF THE INVENTION

Modern electricity installations for residences or commercial locations are measured for their power consumption using standardized meters (watt-hour meters) which are inserted in standardized meter sockets. These meters feed electric distribution panels to which various electric loads either single phase, dual phase or three phase are connected.

Electric installations are sized at time of construction for a maximum load size with a typical assumption that the service is sized with every device activated simultaneously. Modifying the size and/or capacity of the service connection can be time consuming and costly and require the consent and financial coverage by the owner of the property where the service is provided.

Typically the occupant, owner, or tenant of the property is responsible for paying for electrical energy usage based on the meter count for the corresponding electrical service. In the case of multi-occupant facilities, meters are often placed for each unit so that the occupant need only pay for the energy used for their unit.

Parties desiring to supplement electrical energy generation such as by way of renewable photovoltaic power, geothermal power, fuel cell, wind power or other such onsite generation must typically allow for the possible condition where the total onsite generation may exceed the instantaneous load of the occupant's meter. This back-feeding condition causes electricity to flow into the electricity grid and is highly regulated to ensure the safe operation of the grid in these backflow conditions and also typically requires changes to meter rate plans and possibly to upgrades at property owner expense for wiring, metering and utility side infrastructure. Such changes take time and are costly.

Therefore, the present invention addresses these needs for simpler and faster interconnect means that allow for lower cost installation to more locations with less pre-planning and shorter lead times to accomplish the interconnect that can handle potentially more locally generated power.

SUMMARY OF THE INVENTION

The invention provides for intelligent control of a series of inverters coupled with dynamic load controllers and assignable either singly or in multiples to a desired set of output meters with active anti-backfeed circuitry. The inverters are typically powered from a battery that supply the inverters through a set of controls as further described herein. The invention may be applied as a standalone system or as a component of an integrated solution. It shall be understood that different aspects of the invention can be appreciated individually, collectively or in combination with each other.

Other goals and advantages of the invention will be further appreciated and understood when considered in conjunction with the following description and accompanying drawings. While the following description may contain specific details describing particular embodiments of the invention, this should not be construed as limitations to the scope of the invention but rather as an exemplification of preferable embodiments. For each aspect of the invention, many variations are possible as suggested herein that are known to those of ordinary skill in the art. A variety of changes and modifications can be made within the scope of the invention without departing from the spirit thereof.

INCORPORATION BY REFERENCE

All publications, patents, and patent applications mentioned in this specification are herein incorporated by reference to the same extent as if each individual publication, patent, or patent application was specifically and individually indicated to be incorporated by reference.

BRIEF DESCRIPTION OF THE DRAWINGS

The accompanying drawings, which are incorporated in and constitute a part of the specification, illustrate embodiments of the disclosure and together with the general description of the disclosure given above and the detailed description of the drawings, given below, explain the principles of the disclosure.

Figure 1:
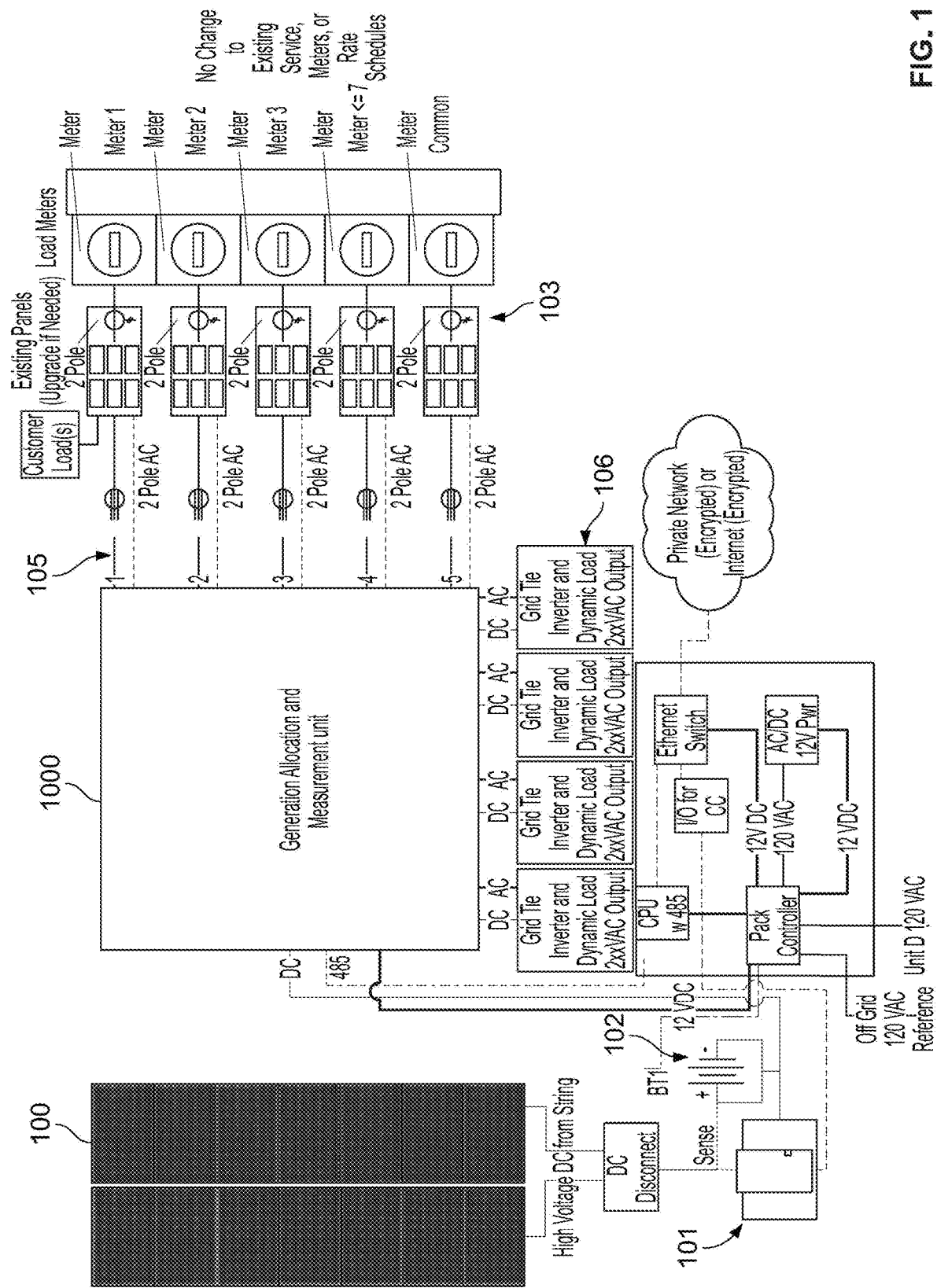
FIG. 1 is a full system schematic of the present invention.

The drawings are not necessarily to scale. In certain instances, details that are not necessary for an understanding of the disclosure or that render other details difficult to perceive may have been omitted. It should be understood, of course, that the disclosure is not necessarily limited to the embodiments illustrated herein.

DETAILED DESCRIPTION OF THE INVENTION

The present invention provides its benefits across a broad spectrum of endeavors. It is applicant's intent that this specification and the claims appended hereto be accorded a breadth in keeping with the scope and spirit of the invention being disclosed despite what might appear to be limiting language imposed by the requirements of referring to the specific examples disclosed. Thus, to acquaint persons skilled in the pertinent arts most closely related to the present invention, a preferred embodiment of the system is disclosed for the purpose of illustrating the nature of the invention. The embodiments described herein are illustrative, and as will become apparent to those skilled in the art, can be modified in numerous ways within the scope and spirit of the invention, the invention being measured by the appended claims and not by the details of the specification.

Although the following text sets forth a detailed description of numerous different embodiments, the legal scope of the description is defined by the words of the claims set forth at the end of this disclosure. The detailed description is to be construed as exemplary only and does not describe every possible embodiment since describing every possible embodiment would be impractical, if not impossible. Numerous alternative embodiments could be implemented, using either current technology or technology developed after the filing date of this patent application, which would still fall within the scope of the claims.

It should also be understood that, unless a term is expressly defined herein, there is no intent to limit the meaning of that term, either expressly or by implication, beyond its plain or ordinary meaning, and such term should not be interpreted to be limited in scope based on any statement made in any section of this patent (other than the language of the claims). To the extent that any term recited in the claims at the end of this patent is referred to in this patent in a manner consistent with a single meaning, that is done for sake of clarity only so as to not confuse the reader, and it is not intended that such claim term by limited, by implication or otherwise, to that single meaning. Finally, unless a claim element is defined by reciting the word "means" and a function without the recital of any structure, it is not intended that the scope of any claim element be interpreted based on the application of 35 U.S.C. § 112, subparagraph (f).

Embodiments of the present invention relate to the process of interconnecting an onsite generation system to one or more destination loads without back feed and little or no required upgrade or interaction with a given local utility such as those used in current consumer or commercial applications. Further, the automatic adjustment to accommodate with dynamic assignment and power control of inverters with load following increases the value and convenience and lowers potential conflicts in operations leading to more utilization in properties where such energy delivery from onsite generation systems has previously been impractical.

Referring to FIG. 1 shown is an example of full system schematic employing a solar photovoltaic panel as a power generator 100. Other power generation devices can be employed equally without departing from the spirit and scope of the invention. The photovoltaic panel 100 generates and delivers power at a usable, typically lower, voltage to a DC-DC charge controller 101 which is connected inline to a one or more batteries 102 and to one or more generation allocation and measurement devices ("allocator device") 1000, as further described herein.

Energy supplied by the power generator 100 is drawn from battery array 102 to the generation allocation and measurement allocator device 1000 and is used to generate grid synchronized AC power which is delivered to one or more destination loads, each of which is separately metered. The energy is delivered without back feed to prevent the need for any service size changes or metering changes at the load meter to be utilized. The allocator device 1000 impact the overall system as a reduction in load, much like turning down or off an appliance.

The amount of energy delivered to the destination metered distribution panels 103 is determined by an allocation table summing to 100% which sets a percentage of daily generated energy from the generator 100 to be delivered to each destination metered distribution panel 103. The table is determined by the analysis of a meter's historic load (or by predetermined manual confirmation) and is entered into a multi-allocator controller of the allocator device 1000, either manually or via communication with an automated cloud based application which manages the sign up, analysis and communication of the resultant table to the controller.

In some embodiments, the allocator device 1000 comprises multiple unit controllers, an inverter assignment matrix, and multiple controllable loads as further described herein. The unit is connected to one or more multi-allocator controller modules which enable internet and local area network connectivity, reporting, and local control of the allocator device 1000. In some embodiments, allocator device 1000 is connected to one or more standard sockets 105 which provide single, dual, or three phase power to the metered distribution panels 103. The allocator device 1000 is also connected to one or more inverters 106.

Figure 2:
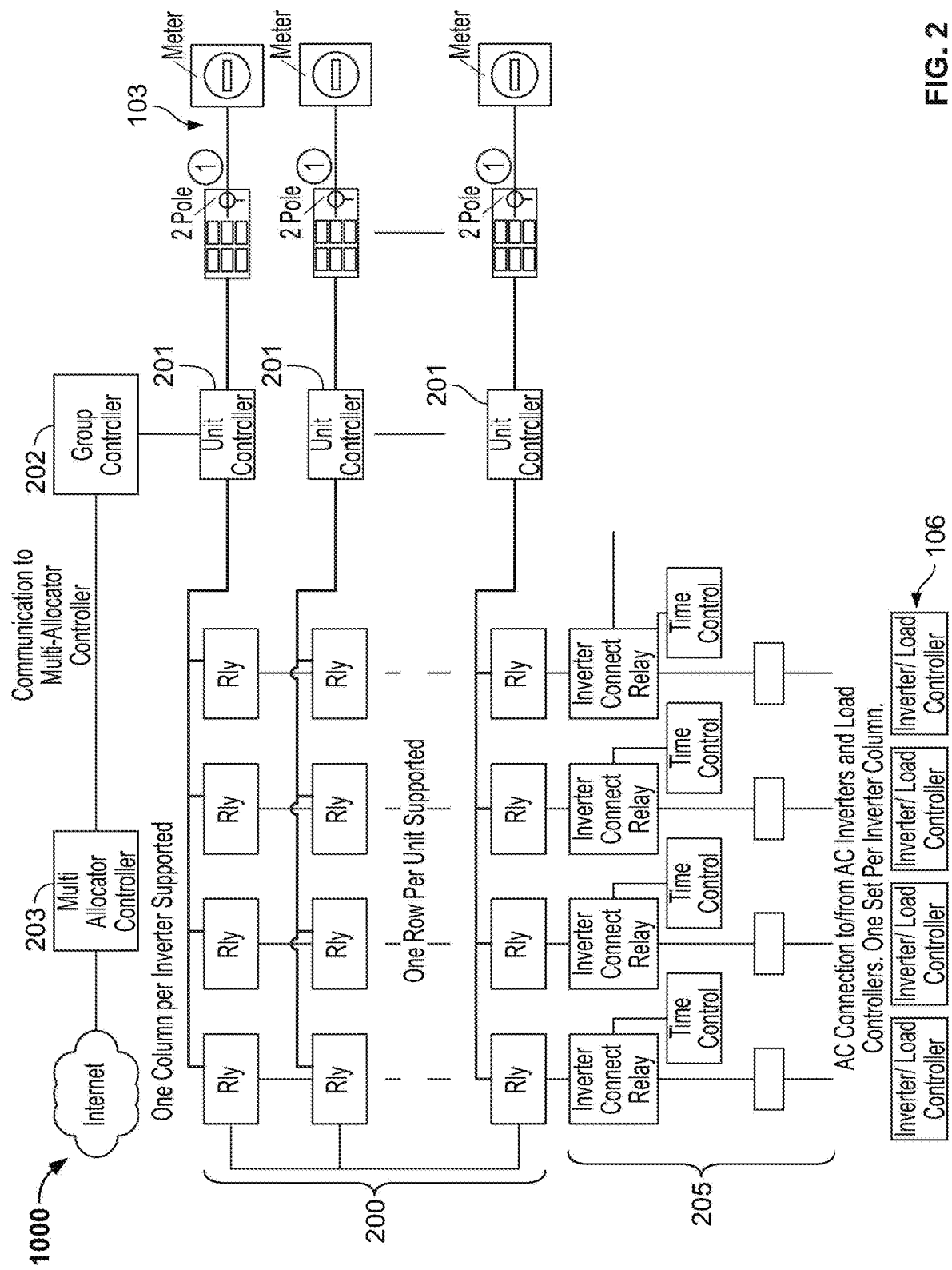
FIG. 2 is a schematic of the generation allocation and measurement unit of the present invention.

Referring to FIG. 2, shown is certain detail of the generation allocation and measurement allocator device 1000. In some embodiments, allocator device 1000 comprises an inverter assignment matrix 200 fed by a one or more inverter load controllers 205, one or more unit controllers 201, a group controller 202 in communication with the unit controllers 201, and an Internet-enabled multi-allocator controller 203 in communication with the group controller 202. The allocator device 1000 determines and dispatches commands to the group controller 202 which in turn controls the percentage of energy to be delivered to each unit controller 201, which unit controllers control the output to the respective metered distribution panels 103. The allocator device 1000 is also configured to periodically update the total power available to the particular allocator device 1000. The precise method by which such delivery and delivery control is achieved efficiently after receiving instruction starts with the unit controller 201 shown in FIG. 3 and described below. In some embodiments, there is one unit controller 201 for each output metered distribution panel 103. The multi-allocator controller 203 monitors multiple allocator devices 1000 and associated power generators 100 and batteries 102 and acts to manage communications and necessary upgrades and updates from a Cloud-based control system.

Figure 3:
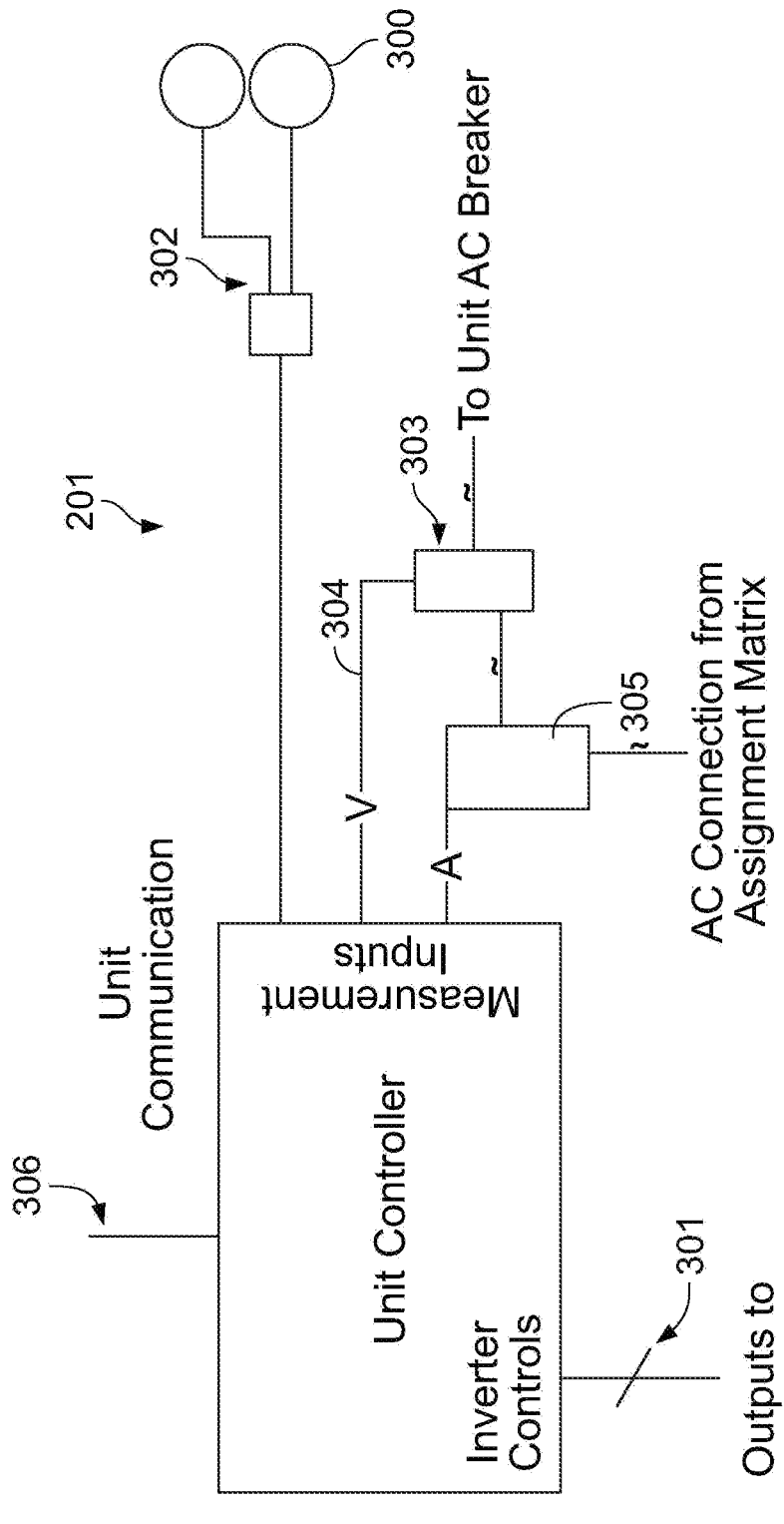
FIG. 3 is a schematic of the unit controller of the generation allocation and measurement unit shown in FIG. 2.

As shown in FIG. 3 the unit controller 201 subsystem is responsible for continuously monitoring the current level, current direction and voltage of the allocator device 1000 to which it is connected. The unit controller continuously measures the current being delivered by the inverters (106 in FIG. 1) assigned to the allocator device 1000. Energy delivery is accumulated and reported to the group controller as well as tracked to assure that over delivery does not occur. Back feed of current as seen at point 300 is prevented by the unit controller by continuously comparing the current at 300 and disabling one or more assigned inverters via switch 301 when the current at 300 gets within a target threshold or is negative (i.e., feeding to grid).

In some embodiments, the unit controller 201 itself is a microcontroller subsystem as commonly available but adjusted with additional elements and software to reflect the requirements of the invention. These elements are comprised of communication, measurement inputs and output control elements controlled by the embedded software. In some embodiments, the current at point 301 is measured by one or more current transformers configured to measure the load on metered distribution panel 103 associated with the unit controller 201. This is typically installed ahead of the main break or the metered distribution panel and is configured to measure bi-directionally.

A cable combiner board 302 is provided to simplify wiring for modular connections from multiple cables to a single cable, to simplify installation. A voltage measurement circuit 303 comprising a transformer and a voltage divider may be attached to one or more legs of AC breaker of the allocator device 1000, depending on implementation and voltage being measured. A voltage sense signal 304 is passed from the AC breaker of the allocator device 1000 to the unit controller for control. A current measurement circuit 305, typically a Hall effect sensor, measures current from the inverter assignment matrix to the AC breaker of the allocator device 1000. A unit communication connection 306 connects the unit controller 201 to the group controller 202. This connection may be serial, USB, I2C or other similar bus connections, which are used to report data, status, and to accept instructions from the group controller. Direct output 301 controls the inverters 106 based on an enabling or disabling signal received from the unit controller, depending on load level and status of available energy.

Figure 4:
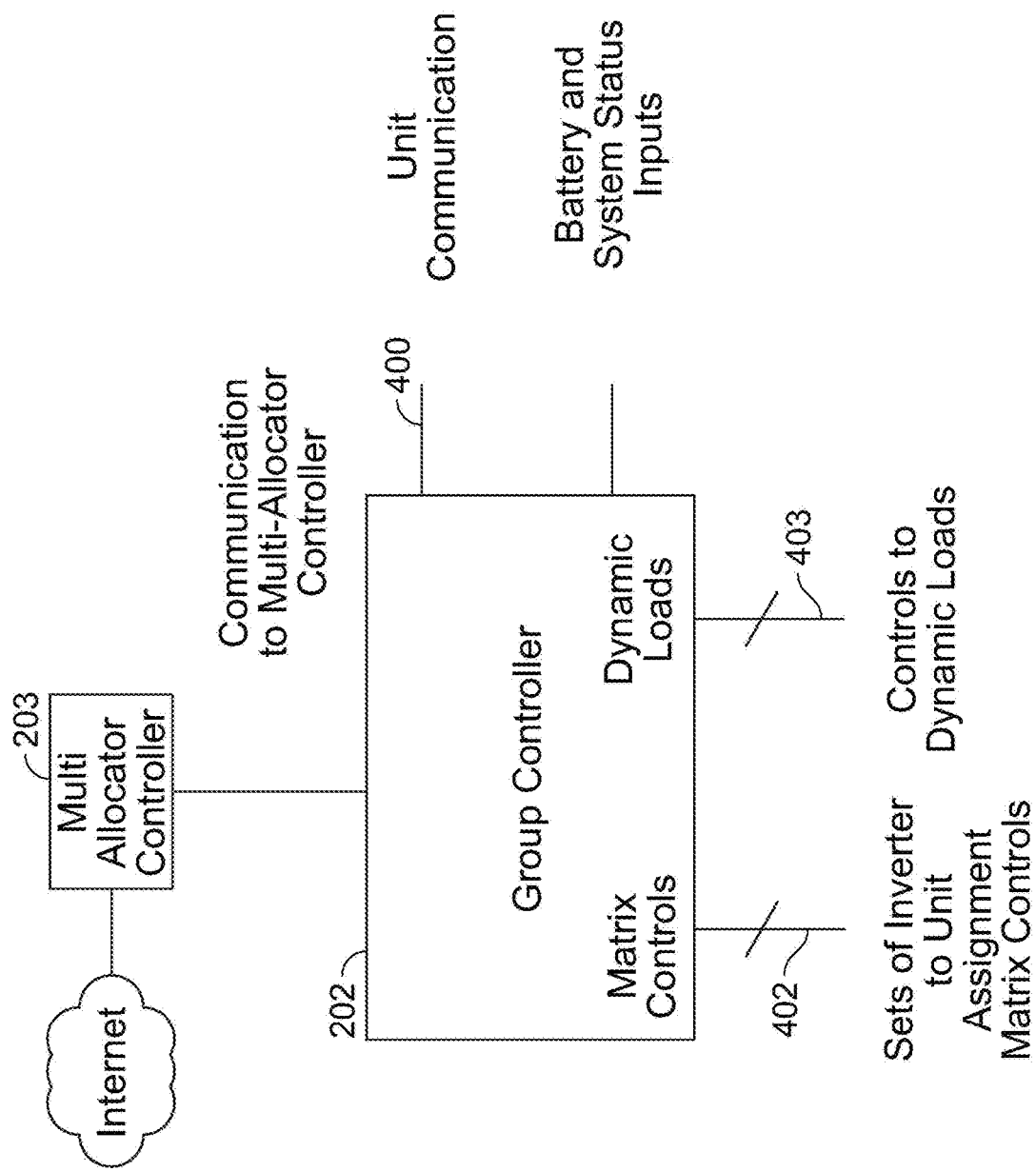
FIG. 4 is a schematic of the group controller of the generation allocation and measurement unit shown in FIG. 2.

Referring to FIG. 4 shown are the components of the group controller 202 which manages one or more unit controllers 201 as well as the inverter assignment matrix 200 and communications with the allocator device 1000. The group controller 202 is capable of autonomous operation based on last provided parameters should the multi-allocator controller 203 be missing or out of service.

As shown in FIG. 4 the group controller 202 subsystem acts to manage multiple unit controllers 201 and to control and manage the assignment of inverter pairs to the output units to which energy is to be delivered. The group controller 202 receives allocation share instructions from the multi-allocator controller 203 and tracks and instructs unit controllers 201 appropriately. In real time as energy is being delivered, the group controller 202 also issues coordinated instructions to inverter load controllers 205 paired with the assigned inverters 106 based on feedback from the unit controller 201, for example from measurements 300 and 305 (from FIG. 3). Safety override conditions such as grid loss, over temperature and manual rapid shutdown functions are managed through group controller 202 and subsidiary circuits as appropriate.

In some embodiments, the group controller 202 itself is a microcontroller subsystem as commonly available but adjusted with additional elements and software to reflect the requirements of the invention. These elements are comprised of communication, measurement inputs and output control controlled by the embedded software.

The group controller 202 is in communication with the unit controller 202 via signal 400. Output 401 are sets of BCD or similar, configured one set per inverter. With one set of inverter assignment matrix 200 controls per inverter, the system assures that a given inverter may only be connected to a single unit controller 201, however multiple inverters 106 may be assigned to the same unit controller 201. Signal 402 provides output signal and feedback to each inverter. This signal sends control based on feedback from the unit controllers 201 (via signal 403) to adjust the net power level being delivered to a metered distribution panel. In some embodiments, the signal 402 has a fine resolution of at least 100 intervals per inverter, i.e. resolution=inverter wattage/ >=100. Signal 404 provides battery voltage and status inputs and outputs such as battery level, voltage, and external disconnect.

In some embodiments, the multi-allocator controller 203 is in bi-directional communication with the group controller 202 so that the multi-allocator controller 203 can deliver data and receive instructions and update commands. The communication may be established over various known protocols including RS485, Ethernet, 802.xx wifi or similar as appropriate for the implementation.

Figure 5:
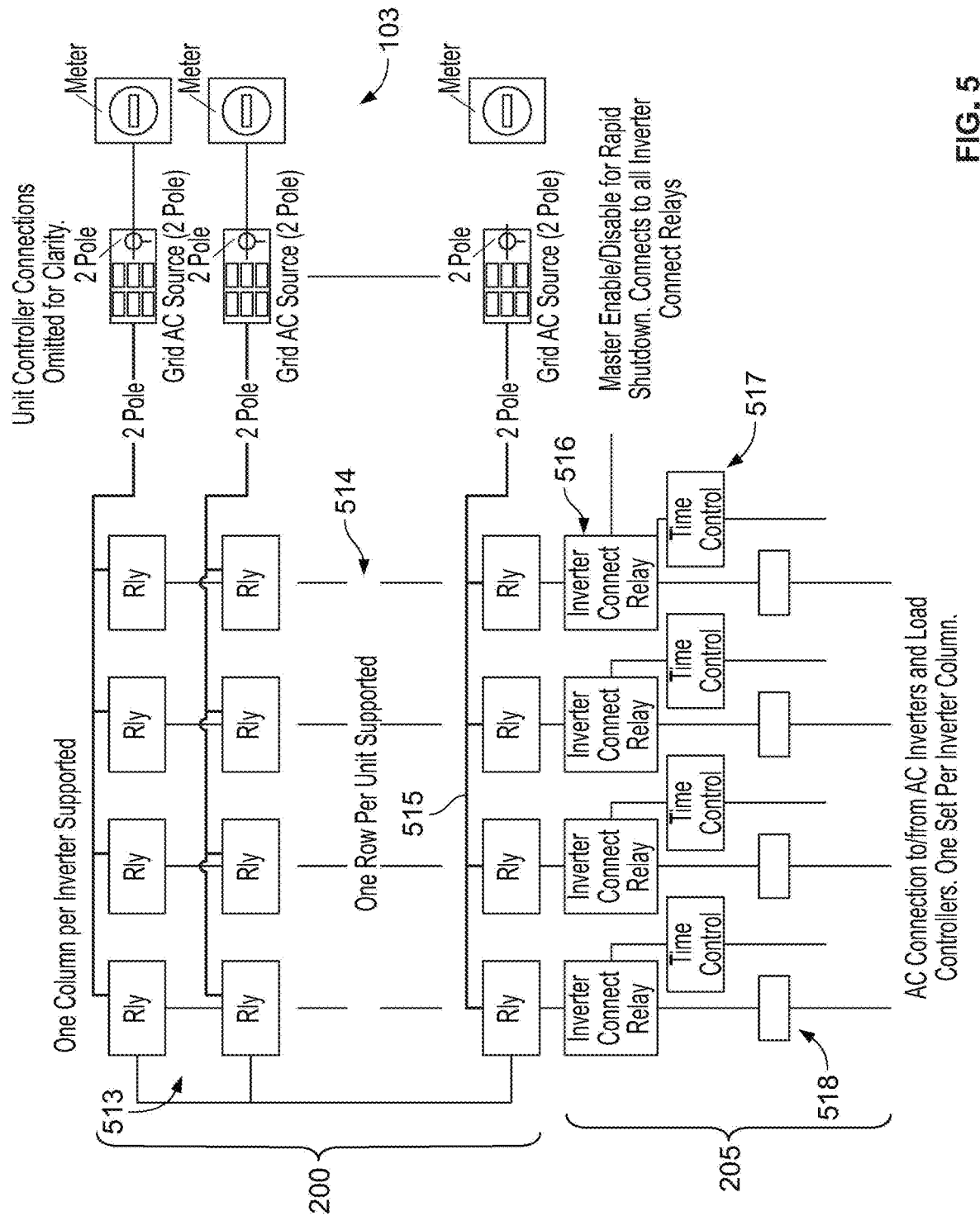
FIG. 5 is a schematic of the inverter assignment matrix of the generation allocation and measurement unit shown in FIG. 2.

Referring to FIG. 5 shown is the inverter assignment matrix 200 which is controlled by the group controller 202 and is connected to one or more unit controllers 201 and is also fed by one or more inverter load controller modules 205. The inverter assignment matrix 200 serves to enable to safe connection, disconnection, reassignment and stacking of connected inverters 106 to connected AC circuits from multiple metered distribution panels. As further shown in FIG. 5, in addition to the connection matrix of [Number of Inverters]×[number of meters supported] this section controls for the safe reconnection by ensuring proper wait times and disconnect procedures so that energy stored in the input side capacitors and energized inverters 106 is safely discharged and the inverters 106 are forced into a resynchronization mode before being reconnected to a live AC circuit. Further, the forcing of the isolation and synchronization facilitates transfer in three phase circuits where each AC circuit is likely to be a separate pairing such as is typically done in buildings wired with 208 VAC or other 3-phase AC.

The inverter assignment matrix 200 enables a given inverter connection 518 to be dynamically connected to one of the output grid AC Sources safely and with precise control. The components of this matrix include an array of relays 513 (mechanical or SSR) interconnected such that they share an inverter bus 514 in column and connected to an output bus 515 in rows. The output buses 515 do not interconnect but serve to carry electricity from a single unit and allow it to be connected into by any of the relays 513 on the inverter buses 514. If an SSR is used it should be a Zero Point Cross detecting SSR. If mechanical state switching must only occur AFTER the inverter connect relay 516 for the inverter column is in an open state. A wait of >=50 mS is required before reconnecting relay array 513 and re-enabling the inverter connected relay 516.

The inverter bus 514 enables AC (2 pole) at the rated current level of the inverter supported in each column. There is one inverter bus 514 per inverter supported. The AC may be single phase 120 VAC, 240 VAC or 2 legs of a three phase AC connection.

Output bus 515 enables the connection from one or more relays 513 to combine to provide power from one or more inverter buses 514 to a metered distribution panel (i.e. the occupant unit). Output buses 515 are not allowed to be cross connected to avoid phase mismatch and assure compliance with safe electrical installation and billing practices.

Inverter connect relay 516 enable a master enable/disable for each inverter under control of the time control circuit 517. This circuit, as shown in U.S. Pat. No. 9,912,160B2 by Applicant (hereby incorporated by reference in its entirety), assures that, if disconnected, the inverter cannot be reconnected until sufficient time has passed to force the inverter to stop flowing electricity and start a resynchronization to the AC power. This assures that the connection/reconnection of the inverter is safe and that for any phase being connected to (for example in a 3-phase system of 2 poles per unit) that there is no phase mismatch.

The time control circuit 517 creates a wait before triggering any disconnection and/or reconnection command. This may happen when an inverter connection 518 is re-assigned to a different unit. This time delay assures that the inverter circuitry is forced into a power down and to perform a resynchronize procedure when the AC connection is restored by the closure of the inverter connect relay 516.

Figure 6:
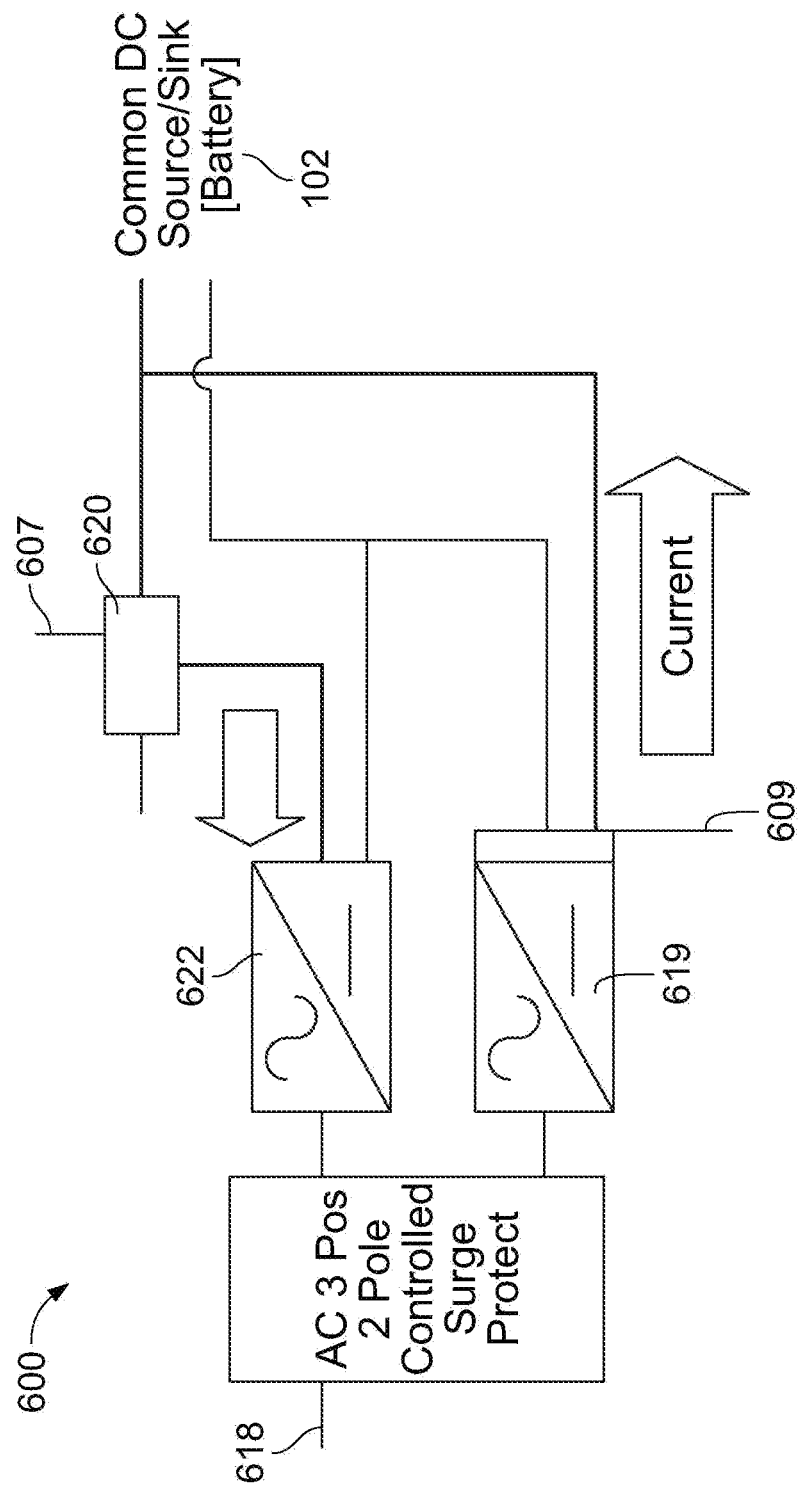
FIG. 6 is a schematic of the inverter/load control block of the generation allocation and measurement unit shown in FIG. 2.

As shown in FIG. 6, a dynamic load circuit 600 provides a desired AC current output level based upon the control set by the group controller 202 inputs. This enables the precise delivery of a desired level of AC power to the destination load (occupant unit, at its meter) while remaining highly efficient. The output current is equal to the power level of the inverter 204 minus the AC draw of the AC to DC controllable load 619. When the input at 609 is adjusted upward or downward the level of net AC at the connection of the controllable load 619 and a grid synchronizable DC to AC inverter 622 that is supplied to AC connection 618 correspondingly. In some embodiments, the controllable load 619 is sized to have a greater output power level than that of the associated inverter 622. The DC output power of controllable load 619 is returned to the battery 102 so as to minimize losses in the system and assure the maximal deliverable energy to the final meter loads. Of note is that the AC connection of the inverter 622 and controllable load 619 remain connected to the AC connection 618 and only the direct current of the inverter is enabled or disabled in synch with the adjustment of the controllable load 619. In this way, the response time of start time to deliver power to the AC connection 618 is reduced as the inverter 622 remains in synch to the AC waveform from AC connection 618 and so does not have to go through a time-consuming synchronization procedure.

Further, as shown in FIG. 6, this subsystem is used to enable a precise level of AC power that is delivered to the connected meter based upon the load level of the meter. This precise control enables the output AC power to more closely match the dynamic level of load a given meter may have on it. By periodically updating this output level based on the unit controller 201 measurements the curve of the meter load can be followed in real time without creating back feed through the meter. Following the load curve closely in real time results in a dramatically higher % of energy that can be delivered to a given meter's load over time when compared to a fixed inverter output.

An on/off signal from 609 synchronizes a surge protection enable to protection at the AC connection 618 whenever the controllable load 619 is enabled.

A DC enable relay circuit 620 with surge protection is also provided, the control of which is set by instruction from signal 607 and the selected unit in control set by group controller 202. In this way a single inverter's activation or deactivation can be dynamically set by different units under the master control of the group controller 202. The common battery 102 supplies and receives DC current for the Allocator system and may be charged from the onsite generation system.

Figure 7:
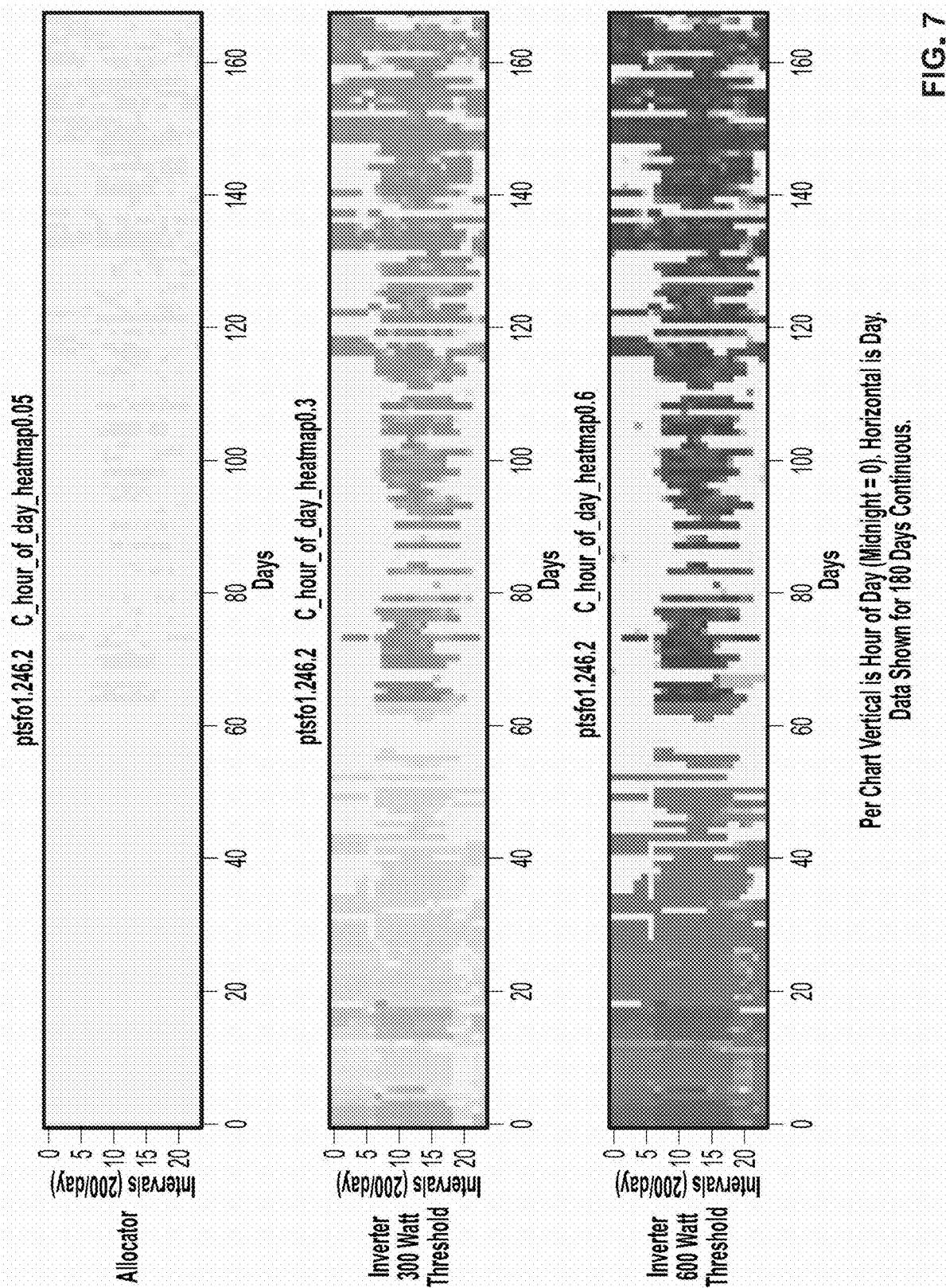
FIG. 7 is a chart illustrating one example of the impact of the present invention in an apartment setting.

As shown in FIG. 7, when using the present invention, following the load curve closely in real time results in a dramatically higher % of energy that can be delivered to a given meter's load over time when compared to a fixed inverter output.

As evident from the present disclosure, the invention described herein provides for distribution of energy and supplementation of electrical energy without the possibility of back feed, due to the active anti-feedback circuit, thereby avoiding the need for changes to utility service and metering and panel capacity. This offers the ability to deliver full economic benefit of supplemental or primary power sources, such as a photovoltaic panel without net metering. The allocator device also has the ability to identify incorrect current transformer placement and orientation and correct for it using the software embedded in the unit controller. Because a battery is employed, the system is able to operate 24 hours a day, 7 days a week rather than only when sunlight or other power generation is active or on; in other words, the system can supplement not only by the power generator, but also by the stored energy in the battery, when the power generator is otherwise inactive or ineffective. This combination of the power generator source and the battery allows the system to feed multiple separate, isolated loads each with a variable load over time. The isolation of loads from one another allows a variable number of inverters 106 to be attached to the system.

Further, the use of DC side switching to inverters speed up the start of energy deliver by allowing the inverter to remain in sync with the grid. The dynamic stacking method allows multiple inverters to be assigned or reassigned to a given load. The pairing of an inverter and a controllable load with measurement capability provides for dynamic AC output level and load following capability. Because the system facilitates single, dual, and three phase support of AC loads due to the reset and resync of inverters, the system has enhanced safety and efficacy. The ability to deliver different amounts of electrical energy and power to each load as required or desire and the time-controlled delivery thereof provides a substantial advantage over known systems in the art. Other advantages include the ability to continue operation when external Internet control is disabled and the ability to maximize energy efficiency and value by delivering to designated common meters if the occupant meters have not or cannot consume all of the energy available.

The included descriptions and figures depict specific implementations to teach those skilled in the art how to make and use the best mode. For the purpose of teaching inventive principles, some conventional aspects have been simplified or omitted. Those skilled in the art will appreciate variations from these implementations that fall within the scope of the invention. Those skilled in the art will also appreciate that the features described above can be combined in various ways to form multiple implementations. As a result, the invention is not limited to the specific implementations described above, but only by the claims and their equivalents.

The foregoing discussion of the disclosure has been presented for purposes of illustration and description. The foregoing is not intended to limit the disclosure to the form or forms disclosed herein. In the foregoing Detailed Description for example, various features of the disclosure are grouped together in one or more embodiments for the purpose of streamlining the disclosure. This method of disclosure is not to be interpreted as reflecting an intention that the claimed disclosure requires more features than are expressly recited in each claim. Rather, as the following claims reflect, inventive aspects lie in less than all features of a single foregoing disclosed embodiment. Thus, the following claims are hereby incorporated into this Detailed Description, with each claim standing on its own as a separate preferred embodiment of the disclosure.

Moreover, though the present disclosure has included description of one or more embodiments and certain variations and modifications, other variations and modifications are within the scope of the disclosure, e.g., the use of a certain component described above alone or in conjunction with other components may comprise a system, while in other aspects the system may be the combination of all of the components described herein, and in different order than that employed for the purpose of communicating the novel aspects of the present disclosure. Other variations and modifications may be within the skill and knowledge of those in the art, after understanding the present disclosure. This method of disclosure is intended to obtain rights which include alternative embodiments to the extent permitted, including alternate, interchangeable and/or equivalent structures, functions, ranges or steps to those claimed, whether such alternate, interchangeable and/or equivalent structures, functions, ranges or steps are disclosed herein, and without intending to publicly dedicate any patentable subject matter.

The invention claimed is:

1. A power generation allocation and measurement device, comprising:

an inverter assignment matrix fed by one or more inverter load controllers;
one or more unit controllers, each associated with a respective metered distribution panel;
a group controller in communication with the unit controllers and the inverter assignment matrix;
wherein the power generation allocation and measurement device is fed by a power generator;
wherein the power generation allocation and measurement device is connected to one or more inverters, the inverters controlled by the inverter load controllers;
wherein the power generation allocation and measurement device allocates power to the metered distribution panels via the group controller;
wherein each of the unit controllers are connected to a current transformer positioned ahead of the respective metered distribution panel to measure the load being fed by the respective meter; and
wherein, to prevent back feed, the power generation allocation and measurement device continuously compares current level and direction at the current transformer with a target threshold and, via the one or more inverter load controllers, adjusts the current level or switches off the inverter if the current level at the current transformer comes within the target threshold.

2. The power generation allocation and measurement device of claim 1, including a multi-allocator control module which enables network connectivity, reporting, and local control thereof.

3. The power generation allocation and measurement device of claim 2, wherein the group controller receives allocation instructions from the multi-allocator controller and correspondingly sends instructions to the one or more unit controllers.

4. The power generation allocation and measurement device of claim 1, wherein the group controller issues coordinated instructions to the inverter load controllers based on feedback received from the unit controller.

5. The power generation allocation and measurement device of claim 1, wherein the group controller is in bi-directional communication with the one or more inverters via the inverter load controllers, the group controller configured to adjust a net power level being delivered to the metered distribution panels based on feedback received from the unit controllers.

6. The power generation allocation and measurement device of claim 1, wherein a DC-DC charge controller is connected between the power generator and the power generation allocation and measurement device.

7. The power generation allocation and measurement device of claim 6, wherein one or more batteries are connected between the DC-DC charge controller and the power generation allocation and measurement device.

8. The power generation allocation and measurement device of claim 1, wherein the inverter assignment matrix comprises an array of relays sharing an inverter bus and an output bus, the output bus enabling the connection from one or more relays of the array of relays to pass power from the inverter buses to the metered distribution panels.

9. The power generation allocation and measurement device of claim 8, wherein the inverter assignment matrix includes a time control circuit to delay triggering of connection or disconnection of the array of relays.

10. The power generation allocation and measurement device of claim 1, including a dynamic load circuit connected to the group controller that enables control of power delivery to the metered distribution panels.

11. A method of allocating power delivery to one or more metered distribution panels, comprising:
providing an allocation device including an inverter assignment matrix fed by one or more inverter load controllers; one or more unit controllers, each associated with a respective metered distribution panel; a group controller in communication with the unit controllers and the inverter assignment matrix; wherein the power generation allocation and measurement device is fed by a power generator; wherein the power generation allocation and measurement device is connected to one or more inverters, the inverters controlled by the inverter load controllers to enable the delivery of a desired level of current to the connected metered distribution panel;
preventing back feed by continuously comparing current level at a current transformer connected between the unit controllers and the respective metered distribution panel with a target threshold and, via the one or more load controllers, either adjusting the current level or switching off the inverter if the current level at the current transformer comes within the target threshold; and
issuing coordinated instructions from the group controller to the inverter load controllers based on feedback received from the unit controller.

12. The method of claim 11, comprising the step of adjusting, via the group controller, a net power level being delivered to the metered distribution panels based on feedback received from the unit controllers.

13. The method of claim 11, comprising the step of receiving, at the group controller, allocation instructions from a multi-allocator controller and correspondingly sending instructions from the group controller to the one or more unit controllers.

14. The method of claim 11, comprising the step of identifying and correcting incorrect placement or orientation of the current transformer based on feedback received from the unit controller.

15. The method of claim 11, comprising the step of enabling the connection of the inverter assignment matrix to the metered distribution panels via one or more relays of the inverter assignment matrix.

16. The method of claim 11, comprising the step of delivering different amounts of power to each metered distribution panel based on the load at each metered distribution panel.

17. The method of claim 11, comprising the step of assigning and reassigning more than one inverter to a respective metered distribution panel based on feedback at the respective unit controller corresponding to the metered distribution panel.

\* \* \* \* \*